(12) United States Patent
Harlacher et al.

(10) Patent No.: US 7,184,272 B1
(45) Date of Patent: Feb. 27, 2007

(54) MODULAR RF TERMINAL HAVING INTEGRATED BUS STRUCTURE

(75) Inventors: Marc A. Harlacher, Herndon, VA (US); Kenneth D. Cunningham, Hamilton, VA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 174 days.

(21) Appl. No.: 10/407,943

(22) Filed: Apr. 7, 2003

Related U.S. Application Data

(60) Provisional application No. 60/369,837, filed on Apr. 5, 2002.

(51) Int. Cl.
*H05K 7/10* (2006.01)

(52) U.S. Cl. .............. 361/729; 361/814; 361/728; 361/735; 361/731

(58) Field of Classification Search .......... 361/735, 361/796, 728–731, 733, 736, 752, 814; 174/50.52, 174/50.53
See application file for complete search history.

(56) References Cited

U.S. PATENT DOCUMENTS

| | | | | |
|---|---|---|---|---|
| 3,054,024 A | * | 9/1962 | Dillen et al. | 361/747 |
| 3,267,334 A | * | 8/1966 | Wulc | 361/735 |
| 3,299,403 A | * | 1/1967 | Young | 375/237 |
| 5,227,957 A | * | 7/1993 | Deters | 361/686 |
| 5,481,073 A | * | 1/1996 | Singer et al. | 200/1 R |
| 5,636,214 A | * | 6/1997 | Kranzler et al. | 370/438 |
| 5,645,434 A | * | 7/1997 | Leung | 439/74 |
| 5,676,553 A | * | 10/1997 | Leung | 439/74 |
| 5,691,885 A | * | 11/1997 | Ward et al. | 361/735 |
| 5,805,596 A | * | 9/1998 | Kranzler et al. | 370/445 |
| 6,067,585 A | * | 5/2000 | Hoang | 710/11 |
| 6,098,131 A | * | 8/2000 | Unger et al. | 710/303 |
| 6,144,561 A | * | 11/2000 | Cannella et al. | 361/796 |
| 6,201,698 B1 | * | 3/2001 | Hunter | 361/704 |
| 6,219,240 B1 | * | 4/2001 | Sasov | 361/704 |
| 6,574,110 B1 | * | 6/2003 | Budinger et al. | 361/729 |
| 6,665,189 B1 | * | 12/2003 | Lebo | 361/730 |

* cited by examiner

*Primary Examiner*—Tuau Dinh
*Assistant Examiner*—Dameon E. Levi
(74) *Attorney, Agent, or Firm*—Edell, Shapiro & Finnan, LLC

(57) ABSTRACT

A miniature, multimode, modular RF terminal includes a plurality of processing modules, where at least one of the processing modules includes an external connector for conveying an input or output RF signal. The terminal further includes a segmented coaxial analog bus comprising a plurality of multi-conductor coaxial connectors, wherein each of the multi-conductor coaxial connectors is integrated in or forms a portion of one of the processing modules, and wherein the segmented coaxial analog bus conveys RF signals between the processing module having the external connector and at least one other processing module. The modules of the terminal can be arranged in a stack, on a rigid substrate, connected via a flexible substrate or combinations thereof. The terminal supports processing of communication, navigation and sensor signals.

27 Claims, 9 Drawing Sheets

MODULAR RF TERMINAL HAVING INTEGRATED BUS STRUCTURE

CROSS REFERENCE TO RELATED APPLICATION

This application claims priority from U.S. Provisional Patent Application Ser. No. 60/369,837 entitled "Miniature Multifunctional Integrated Terminal," filed Apr. 5, 2002. The disclosure of this provisional patent application is incorporated herein by reference in its entirety.

BACKGROUND OF THE INVENTION

1. Field of the Invention

The present invention relates to a modular RF terminal and, more particularly, to a miniature terminal including discrete, reconfigurable modules interconnected by high-density analog and digital busses for distributing communication, navigation, sensing and control data among the modules.

2. Description of the Related Art

In digital devices that generate and process RF signals, such as modern transceivers, it is beneficial to minimize the size, weight, power consumption and cost. For example, such goals are required for the equipment to be used in the Earth Science Enterprise (ESE) mission through which NASA is engaged in the exploration of Earth, with the goal of understanding and predicting natural phenomena, and the interconnection of atmosphere, oceans, continents, and living ecosystems. More particularly, this exploration is intended to develop a scientific understanding of the Earth system and its response to natural or human-induced changes to enable improved prediction of climate, weather and natural hazards, which may lead ultimately to an improved quality of life and sustained habitability of the Earth. The Advanced Component Technology (ACT) Program sets forth two objectives for technology that supports the ESE mission. First, new electronic systems must address risk, cost, size, and development time reduction while spanning instrumentation, varying platforms, and information systems. Second, new electronic systems must truly be enablers for new forms of Earth measurements and observations, including surface, space-borne, and airborne measurements.

Such systems require transceiver capabilities to support communications, navigation and/or processing of sensor data. Depending on particular mission requirements, there may be a need to support communications that include air or space to ground communications, satellite cross-link communications, and data relay. Navigation requirements may include position/time determination and absolute/relative navigation. Examples of sensing that may require support include: ocean topography measurement, ocean surface wind measurement, occulation measurement, measurement of topography and surface changes, soil moisture and salinity, and global precipitation. In some cases, the system electronics must be able to support a phased array antenna having numerous discrete transmit/receive elements capable of electronic beam forming and steering and requiring separate corresponding transmit and receive channels.

To meet these objectives and system requirements, there has been an effort to develop electronics suitable for airborne and space-borne systems that perform multiple functions while having reduced size, weight, power and cost relative to existing systems. However, miniaturization of RF and transceiver components and packaging cannot be realized without overcoming a number of technical obstacles. For example, practical problems such as heat dissipation, the placement and size of external connectors, and the layout of circuit boards and positioning of internal components must be addressed. One particularly difficult problem that arises with attempts to minimize transceiver size is how to reduce the amount of space required for wiring and signal conductors that convey signals to various analog and digital processing circuitry within the transceiver.

In modern transceivers and most electronic devices of a digital nature, digital busses pass multi-bit (e.g., sixteen bit, thirty-two bit, etc.) digital samples through the system. If the system must support multiple signals simultaneously, additional sets of discrete signal conductors must be added, or the multiple signals must be passed over the same digital bus in a time-shared manner. To achieve a compact transceiver design, the number of signal conductors should be minimized to the greatest extent possible; thus, bus time sharing is a more viable option with miniaturization. However, every digital bus has a maximum speed of operation, and time sharing among multiple signals effectively reduces the throughput supported by the bus with respect to individual signals. Depending on whether the digital signals are eight bits, sixteen bits, thirty-two bits, etc., this problem expands with the number of bits of the digital signals. Thus, signal bus requirements can become a major impediment to reducing the size of electronic devices that digitally process RF signals. In a practical context, the problem of digital bussing becomes unmanageable when attempting to develop a reduced-size RF transceiver capable of supporting a phased-array antenna, since each antenna element transmits and receives separate RF signals, each of which involves processing of multi-bit digital samples.

More generally, given the variety of sensing, communication and navigation capabilities required throughout a complex, multifunctional system, such as that contemplated by the ESE mission, there are considerable risks associated with development time, development, equipment and operational costs, and system reliability. Thus, development of an architecture that addresses these risks would be desirable.

SUMMARY OF THE INVENTION

A miniature, multimode, modular RF terminal includes a plurality of processing modules, where at least one of the processing modules includes an external connector for conveying an input or output RF signal. The terminal further includes a segmented coaxial analog bus comprising a plurality of multi-conductor coaxial connectors, wherein each of the multi-conductor coaxial connectors is integrated in or forms a portion of one of the processing modules, and wherein the segmented coaxial analog bus conveys RF signals between the processing module having the external connector and at least one other processing module.

The multi-conductor coaxial connectors can be multi-pin connectors mounted on circuit boards within the processing modules, or the conductors of the multi-conductor coaxial connectors can extend through holes in the housing frame along the perimeter of the processing modules to conserve further space. The multi-conductor coaxial connectors are selectively populated with conductors, such that analog signals are selectively routed along segments of the segmented coaxial bus between adjacent processing modules. The analog bus can convey any of a variety of analog signals, such as RF signals, intermediate frequency (IF) signals, and local oscillator (LO) reference signals.

Each of the processing modules comprises a substantially plate-like layer structure, including a housing comprising a perimeter wall providing spacing between first and second substantially flat, parallel surfaces, wherein conductors of the multi-conductor coaxial connectors extend in a direction substantially orthogonal to the first and second surfaces. In accordance with one embodiment, at least some of the processing modules are arranged in a stacked configuration with abutting first and second surfaces, wherein corresponding conductors of coaxial connectors of adjacent processing modules are electrically connected to form segments of the segmented coaxial analog bus. In another embodiment, at least some of the processing modules are mounted on a rigid substrate. In yet another embodiment, at least some of the processing modules are interconnected by a flexible substrate. Combinations of the stacked, rigid substrate and flexible substrate arrangements can be employed in the terminal, as required by particular applications. In the stacked configuration, the terminal has a substantially rectangular parallelepiped shape, such as a substantially cube-like shape.

The modular RF terminal further includes a digital bus comprising a plurality of multi-conductor connectors, with each of the multi-conductor connectors being integrated in or forming a portion of one of the processing modules, wherein the digital bus conveys digital signals to the processing modules. The multi-conductor digital connectors can be multi-pin connectors mounted on circuit boards within the processing modules, or the conductors of the multi-conductor digital connectors can extend through holes in the housing frame along the perimeter of the processing modules to conserve further space.

The modular RF terminal can include at least one RF transmit module and one RF receive module to function as a transceiver, and the number of transmit and receive channels is expandable by adding additional modules to the terminal. The terminal includes at least one digital signal processing module which can be configured to process communication, navigation and sensor signals, as needed by a particular application.

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

FIG. 9 is an illustration of an interconnection of coaxial conductors in the segmented analog bus.

DESCRIPTION OF THE PREFERRED EMBODIMENTS

The disclosed miniature multifunctional integrated terminal is a small, modular, highly configurable terminal capable of integrating many different subsystems, including sensors employed by spacecraft, aircraft, and other observation platforms. The terminal addresses the integration of sensory, communication, navigation, and related functions in a single package suitable for use over a wide range of applications and platforms. The terminal yields significant benefits by using a common modular technology that readily scales across various missions and reduces cost and risk to any one mission. By using common processors for sensory, communication and navigation processing, the number of distinct subsystems aboard a platform can be decreased, fusing these functions into a single miniature package. The resulting terminal is designed to be highly scalable and remotely programmable to meet mission specific needs while reducing size, weight, power and cost.

Figure 1:
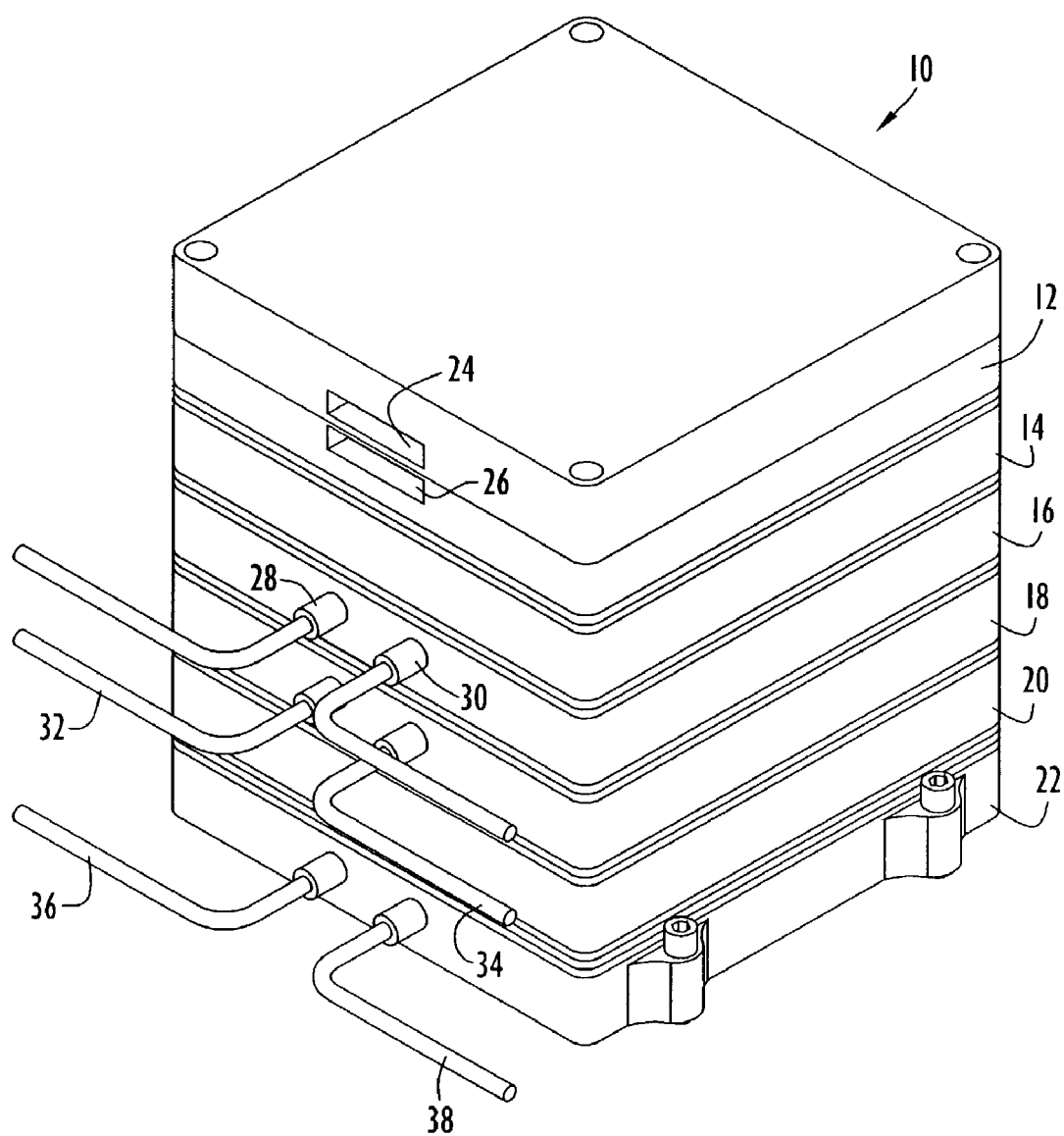
FIG. 1 is a perspective view of a modular RF terminal having a stacked configuration in accordance with an exemplary embodiment.

Referring to FIG. 1, there is shown a perspective view of an embodiment of a multifunctional RF terminal 10 including a set of processing modules arranged in a stacked configuration. In this configuration, the processing modules are stacked together to form a substantially cube-shaped terminal. Terminal 10 shown in FIG. 1 includes six core modules that perform certain basic operations, with each module having a generally rectangular, plate-like shape, and each module forming a layer of the terminal. By way of non-limiting example, the overall dimensions of the core six-layer stacked terminal can be two inches high by two inches wide by two inches long, with a resulting volume of approximately eight cubic inches and preferably weighing less than 1 kg. While the embodiment shown in FIG. 1 is cubic in shape, it will be understood that the terminal is not limited to any particular dimensions or specifications and is not required to be cubic or to have a square or rectangular cross-sectional shape.

From top to bottom, the layered processing modules of terminal 10 include: an interface/power supply module 12, a digital signal processing (DSP) module 14, an RF receiver (RX) module 16, a synthesizer module 18, an RF transmit (TX) module 20, and a high power amplifier (HPA) module 22. While these modules constitute a basic configuration, the invention is not limited to terminals that include all of the modules shown in FIG. 1. In the exemplary configuration shown in FIG. 1, interface/power supply module 12 includes an external power interface 24 and an external data/control interface 26. RF receiver module 16 includes two RF receive inputs 28 and 30, and RF transmit module 16 includes two RF transmit outputs 36 and 38. Optionally, synthesizer module 18 can include external connectors 32 and 34 for conveying various input and output signals to and from the synthesizer module, such as an external reference oscillator to drive the synthesizer or a test port to monitor synthesizer performance. In the configuration shown in FIG. 1, the terminal can simultaneously receive signals in two different bands while transmitting signals in two different bands. DSP module 14 is capable of processing sensory, communication, and/or navigation (i.e., GPS) signals, thereby eliminating the need for separate processors for each type of signal. The nature of the processing is established by programming the field programmable gate array (FPGA) DSP resources resident on DSP module 14. This processing can be altered as needed in order to accommodate changes in mission profiles, priorities, or for other reasons.

The core stack depicted in FIG. 1 is scalable in that additional modules can be added as needed, making the stack higher and giving the terminal a shape that can more generally be characterized as a substantially rectangular parallelepiped. For example, should a mission require use of a phased array antenna for electronic beamforming, a number of RF modules can be added so as to connect an RF RX/TX port on the terminal with each element in the antenna array. By way of non-limiting example, the stack of modules may include sufficient modules to support eight or sixteen discrete RF signals for an eight or sixteen element phased array, resulting in a stack four or more inches high. Electronic beamforming can then be performed by the resident DSP module(s). The terminal is designed for use in space, air, and other environments using commercial/industrial/other grade components according to mission requirements.

Figure 2:
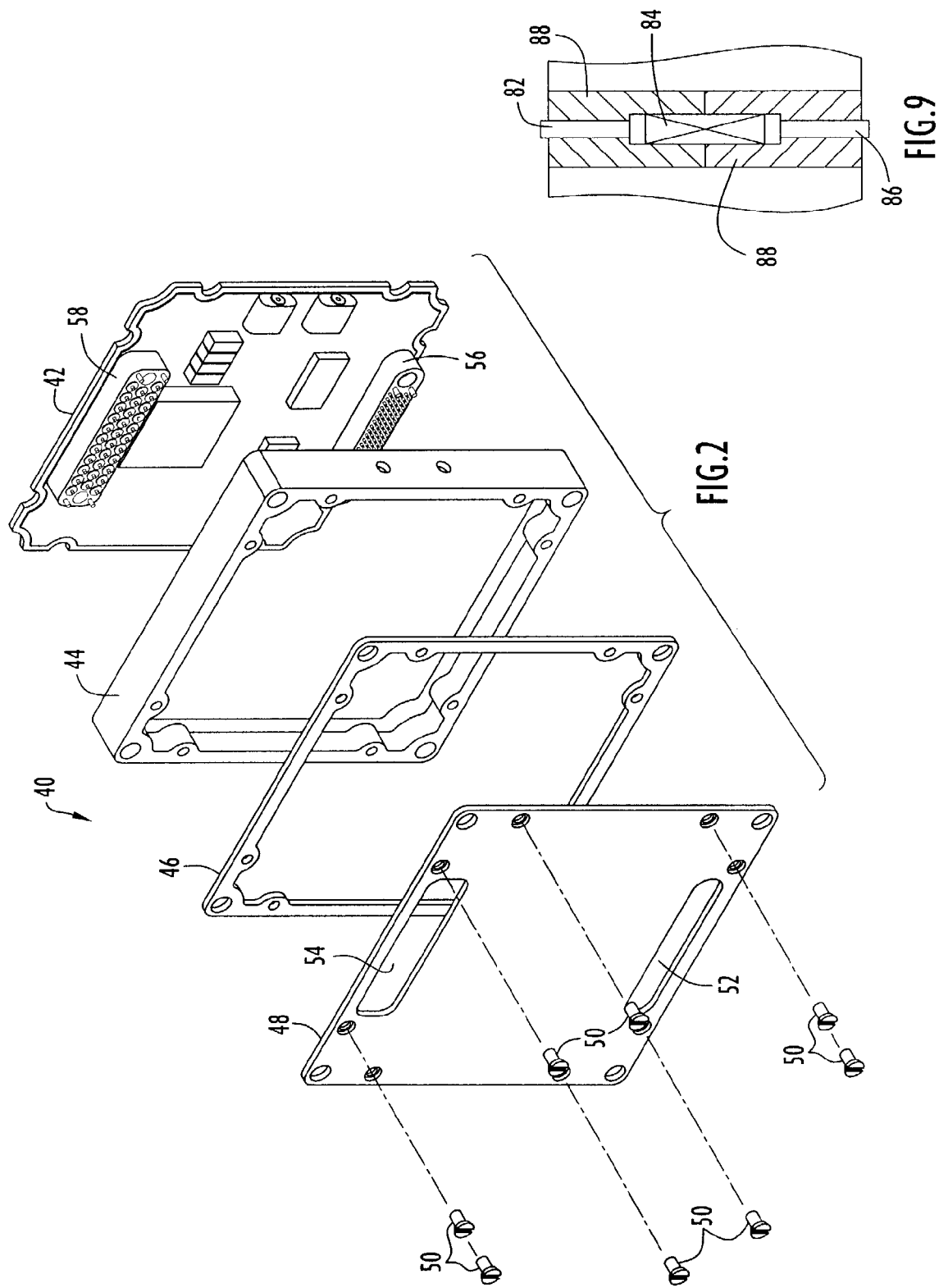
FIG. 2 is an exploded perspective view of a representative module structure.

FIG. 2 is an exploded perspective view of the components of a representative module structure 40. The module includes a printed circuit board or multi-chip element 42, a substantially square, ring-shaped frame 44, a thin, substantially square RF gasket 46, and a bottom housing plate 48. By way of non-limiting example, frame 44 can be aluminum. As used herein and in the claims, the term ring-shaped refers to a structure that extends along the perimeter of the module forming the side walls thereof, and is not limited to any particular shape (e.g., the frame can be generally rectangular, square, circular, or an irregular shape). RF gasket 46 is preferably a highly conductive material, such as copper, and forms a good electrical seal between the bottom plate 48 and ring-shaped frame 44. Bottom plate 48, gasket 46, frame 44 and printed circuit board 42 are secured together with screws 50 and form the housing of module structure 40. Frame 44 serves as a perimeter wall providing a spacing between the circuit board 42 and bottom housing plate 48. Optionally, frame 44 and bottom housing plate 48 can be formed as a single member. Bottom housing plate 48 provides a substantially flat surface suitable for abutting an adjacent module.

Components are mounted on the side of printed circuit board 42 that faces bottom plate 48 to enclose the components within the module. Slots 52 and 54 are formed in bottom plate 48 to receive, respectively, a multi-pin digital connector 56 and a multi-pin coaxial analog connector 58 mounted on printed circuit board 42, such that the connectors are accessible through bottom plate 48, with the conductors of the connectors extending in a direction substantially orthogonal to the plane of the bottom plate. The opposite side of printed circuit board can form a top surface of the module, or a second, top housing plate can be secured over printed circuit board 42. In either case, the top surface of the module is also a substantially flat surface, parallel with the bottom plate, and suitable for abutting an adjacent module.

Figure 3:
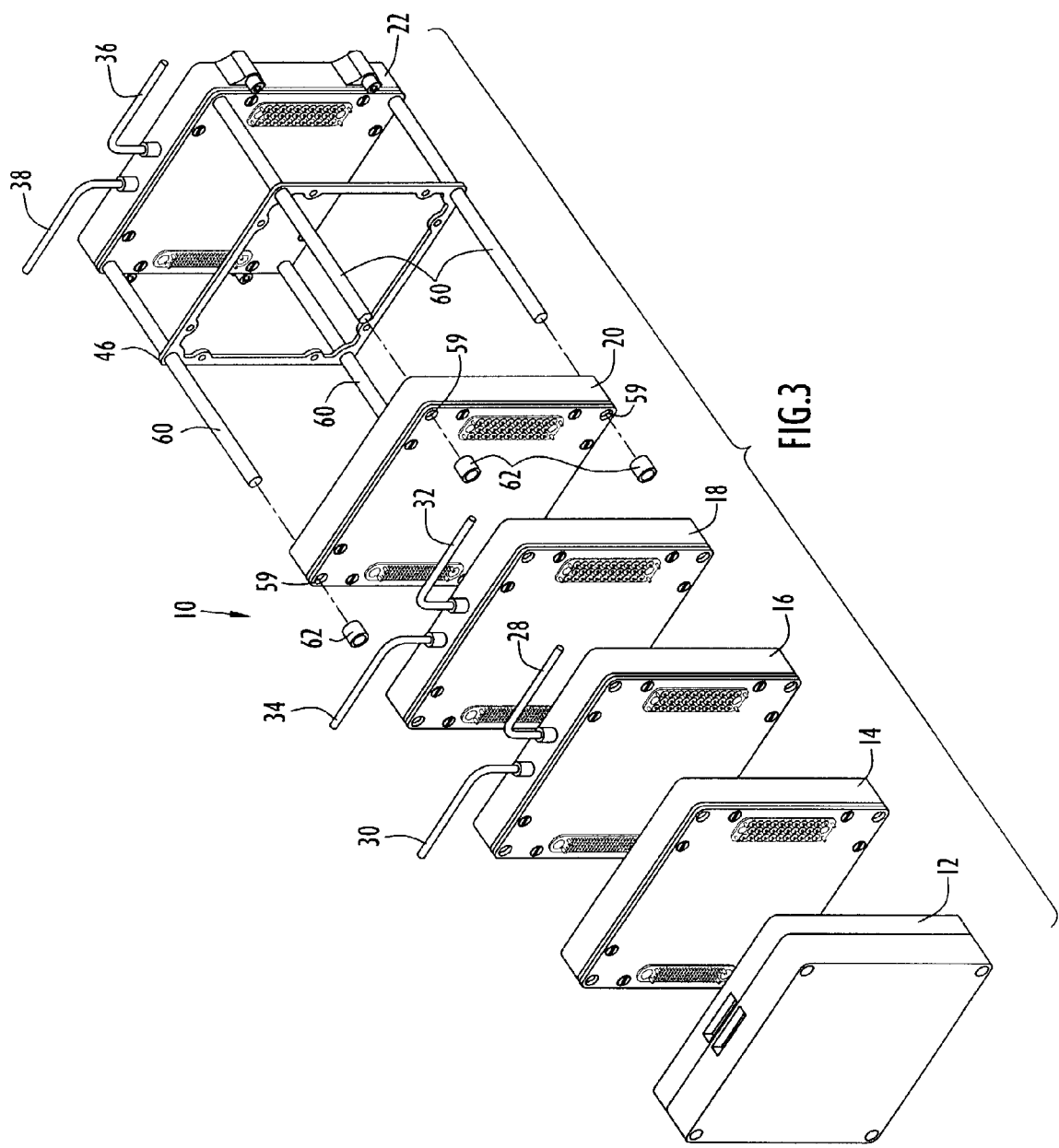
FIG. 3 is an exploded perspective view of the stacked, modular RF terminal.

An exploded view of the core stacked terminal 10 is shown in FIG. 3 with the processing modules separated. Near each of the four corners of each module, through holes 59 extend in the direction of the stack for receiving connector rods 60 which mechanically secure the stack. Optionally, the through holes are sized to receive mechanical inserts or sleeves 62 through which rods 60 extend. Rods 60 are secured at the ends of the stack with screws. It can be seen in FIG. 3 that each of the modules includes a multi-pin digital connector aligned with the digital connectors of the other modules in the direction of the stack. Each module also includes a multi-pin analog connector aligned with the analog connectors of the other modules in the direction of the stack. When the processing modules are connected in the stack, the multi-pin digital connectors are connected to form a high-density digital bus extending through the stack of modules, and the multi-pin analog connectors are connected to form a segmented coaxial analog bus extending through the stack of modules.

An important aspect of the terminal design is the segmented coaxial analog bus concept, which accommodates wide band signal transfer while providing size-efficiency and permitting modular design. As previously described, the number of conductors required to convey multi-bit digital samples and signals within a compact package is problematic, particularly in an RF device required to handle the digital processing associated with several different RF signals simultaneously. The number of conductors required scales with the number of RF signals and the number of digital bits associated with the signals (e.g., thirty-two, eight-bit channels requires 256 individual conductors). In the context of a multimode terminal, numerous signals must be handled to support communications, navigation and sensor signals. It is difficult to disperse all these signals within the limited space of a very small device.

The segmented coaxial analog bus addresses this problem by passing signals, such as RF, IF and local oscillator (LO) signals, among the various modules in analog form. For example, rather than immediately digitizing a received RF signal, the signal is sent from the receiver module to the appropriate processing module within the terminal in its analog format and then digitized locally within the processing module. In this manner, a single coaxial conductor conveys a signal of interest from one module layer to the next in a single path, thereby reducing the space required to pass the signal relative to a multi-conductor digital bus. The segmented analog signal bus reduces the overall size of the terminal while increasing module-to-module signal transfer bandwidth.

Figure 4:
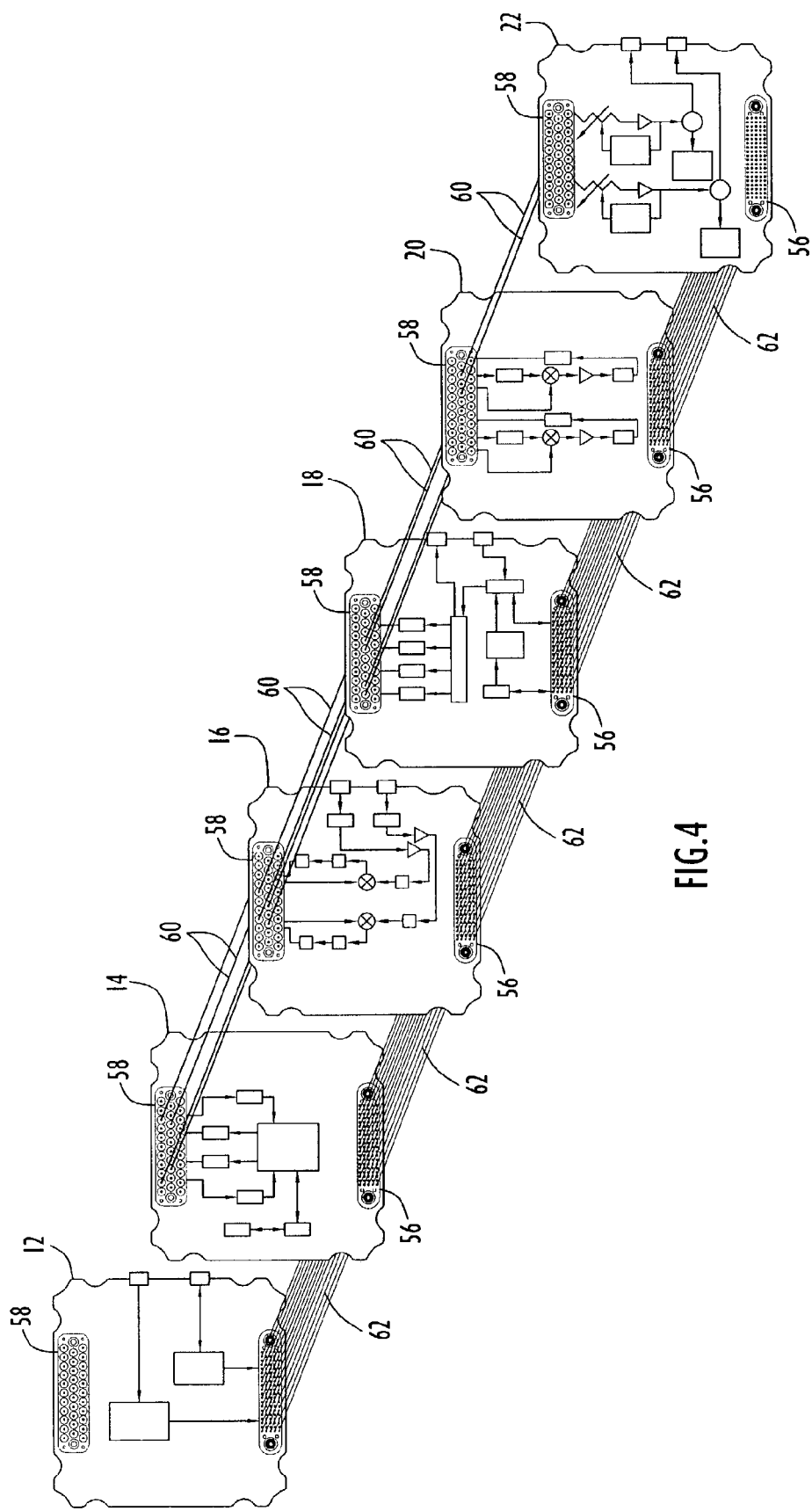
FIG. 4 is an exploded perspective view illustrating interconnections of the digital and segmented analog busses among the modules of the RF terminal.

The nature of the high-density, segmented coaxial analog bus, as well as the high-density digital through bus, is further illustrated in FIG. 4 in the context of the printed circuit boards of the processing modules. Each processing module includes a multi-pin, coaxial connector 58 and a multi-pin digital connector 56 mounted along opposing edges of the printed circuit board (in the orientation shown in FIG. 4, the analog and digital connectors are shown at the top and bottom edges, respectively). Analog signal paths 60 are represented by lines extending between analog connectors on circuit boards of adjacent modules.

Lines 60 shown in FIG. 4 are offset from one set of modules to the next to illustrate that the analog signal paths within the bus structure can be different and/or offset from one module layer to the next. For example, a module may receive an analog signal on one coaxial conductor, pull that signal onto the circuit board and perform operations on the signal, and then put the processed signal back on the segmented bus on a different coaxial conductor to send the signal to the next module layer for further processing. Thus, signals need not travel straight through the stacked terminal along same coaxial conductor line within bus.

More generally, the coaxial connectors of the analog bus can be selectively populated with conductors on a module-by-module basis as needed for passing signals from one module to the next module. The analog bus is thus "segmented" in the sense that each connector in the stack forms a segment of the bus which can be selectively configured to pass or not pass an analog signal on a particular conductor on a module-by-module basis, such that analog signals can selectively be sent over certain segments of the bus to control which signals are available to which modules. Thus, not only does the multi-conductor coaxial connector of each module represent a segment of the overall analog bus; the connector actually provides a bus segmenting capability at the module level. Because the segmented analog bus comprises a plurality of multi-conductor connectors associated with respective modules, by selectively populating the connectors with conductors, there is great flexibility in determining which conductors carry particular signals into and out of each module. For example, it is possible to populate the conductors to form a daisy chain or serpentine type of effect as a signal is moved up and down through the stack. Of course, if necessary or desired, conductors can be populated so that a straight, continuous, conductive path exists through any number of connectors such that a particular signal is available to non-adjacent modules or to multiple modules along the path.

The digital bus is a multi-purpose, high-density bus that extends through the stack and is shared across all of the processing modules. In FIG. 4, digital signal paths 62 are represented by lines extending through the digital connectors 56 on the circuit boards of the processing modules. Contrasting the digital bus with the segmented analog bus, the individual conductors of the digital bus traverse all modules of the stack, whereas individual conductors of the analog bus carry signals between only certain modules as necessary, tailored for the specific linkages required by the particular modules and configuration which make up the terminal. Thus, while the digital bus includes "segments" in that the digital bus comprises a set of interconnected multi-conductor connectors, the digital bus is not "segmented" in the sense of the coaxial analog bus, where individual conductor lines can be selectively populated to control passage of analog signals on a module-by-module basis. The digital bus carries a variety of different digital signals. For example, the digital bus can carry control signals received by interface/power supply module 12 for configuring the processing modules. Likewise, once certain analog signals have been digitized, the digital bus can pass the digital signals to another module, such as to a central point for collection with other signals for further processing. Preferably, such digitized signals have been at least partially processed and can be sent at lower rates than the analog-to-digital sampling rate, thereby requiring far less throughput than would be required to pass raw, multi-bit digital samples of an RF signal, making digital bussing a more viable option.

Figure 5:
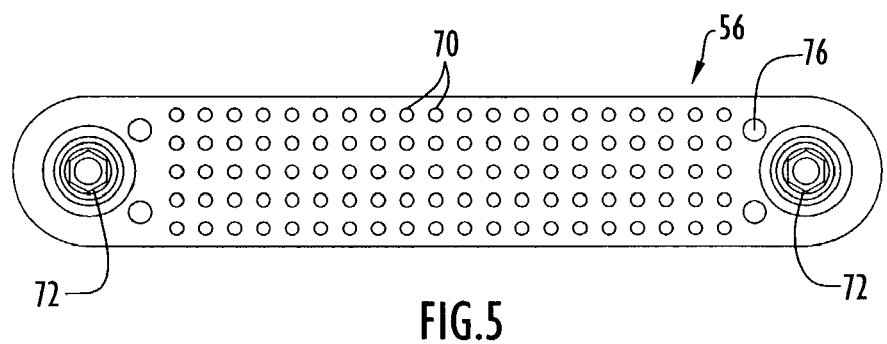
FIG. 5 is a plan view of a high-density digital connector of a module of the RF terminal.
Figure 6:
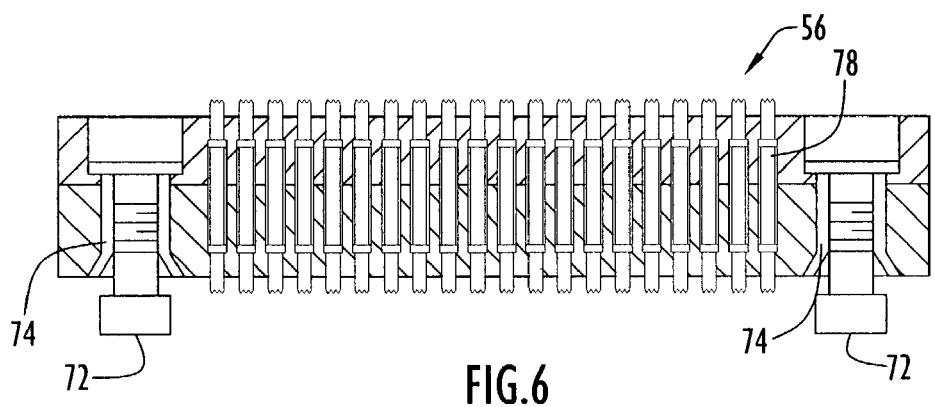
FIG. 6 is a cross-sectional side view of the high-density digital connector.
Figure 10:
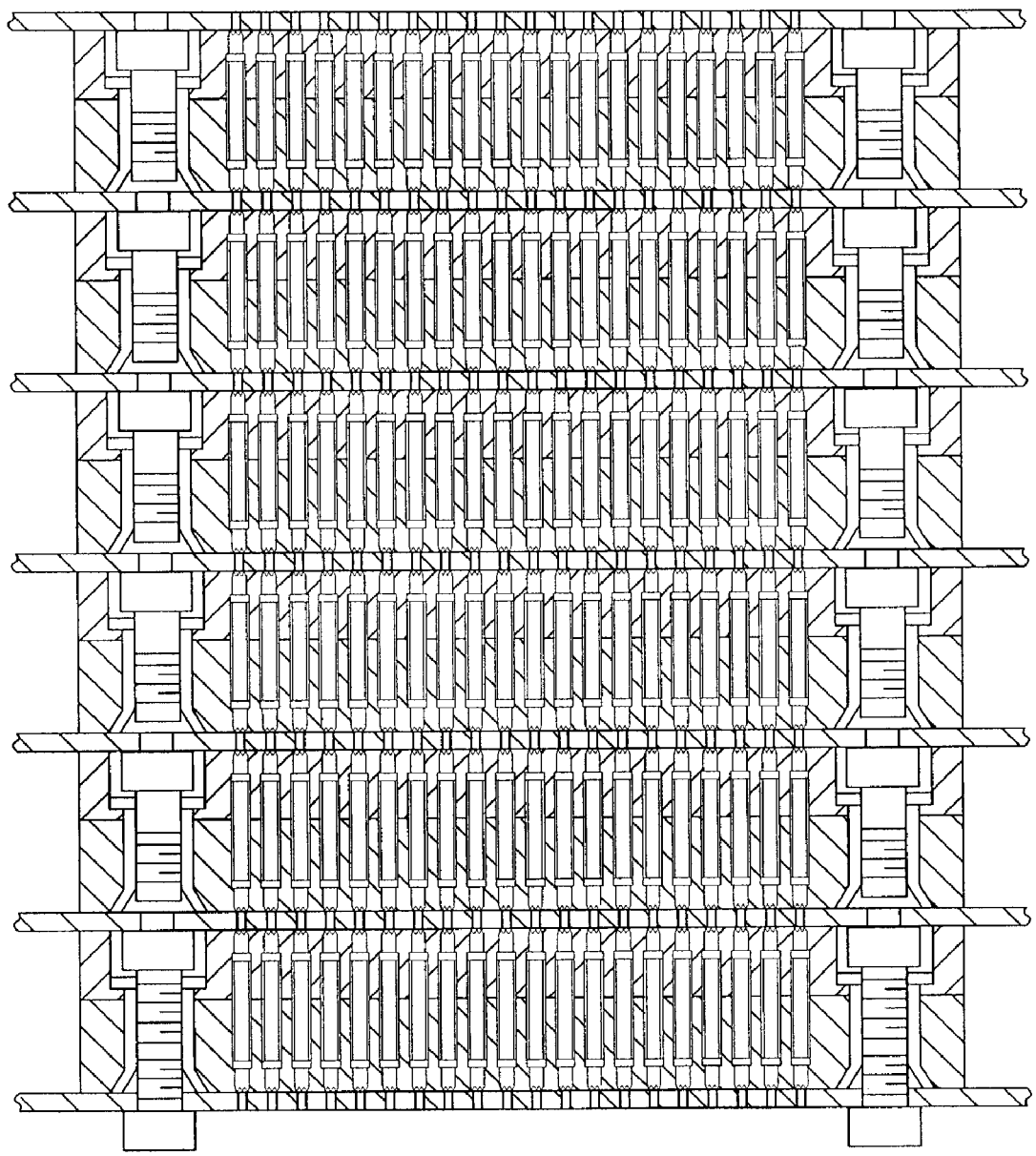
FIG. 10 is a cross-sectional side view of the stacked, modular RF terminal showing the interconnected digital connectors forming the digital bus of the RF terminal.

FIGS. 5 and 6 respectively show a plan view and a cross-sectional side view of a non-limiting representative example of a high-density digital connector 56. It will be understood that the invention is not limited to the particular configuration and dimensions described in connection with these figures. Digital connector 56 is a 100-pin connector having an approximately 1 mm center spacing between adjacent pins 70, with five rows of twenty pins. The overall width of the connector in the direction of the rows is approximately 1.178 inches. With digital data being clocked in the hundreds of megahertz and clocks on the digital-to-analog converter in the gigahertz, there is a need for many connectors that will function as 50 ohm distributed lines. To pass these higher frequencies, the connectors are designed to have a dielectric and center conductor matched to 50 ohms. As seen in FIG. 6, the digital connector is mounted to the circuit board via screws 72 received by threaded eyelets 74. Guide pins 76 (FIG. 5) are used to assist with alignment. The connectors seat on pads and make contact with pads with spring loaded metal crowns 78 that contact pads on the board with sharp edges. FIG. 10 illustrates in cross-section the digital connectors in a multi-module stack, wherein the connectors form the digital bus of the terminal. At each module layer, the screw head functions as a guide for the following connector.

Figure 7:
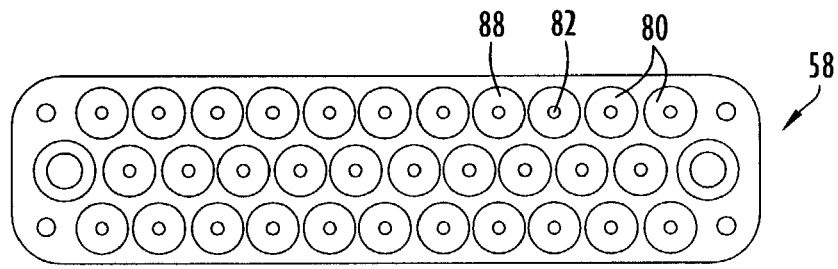
FIG. 7 is a plan view of a high-density analog connector of a module of the RF terminal.
Figure 8:
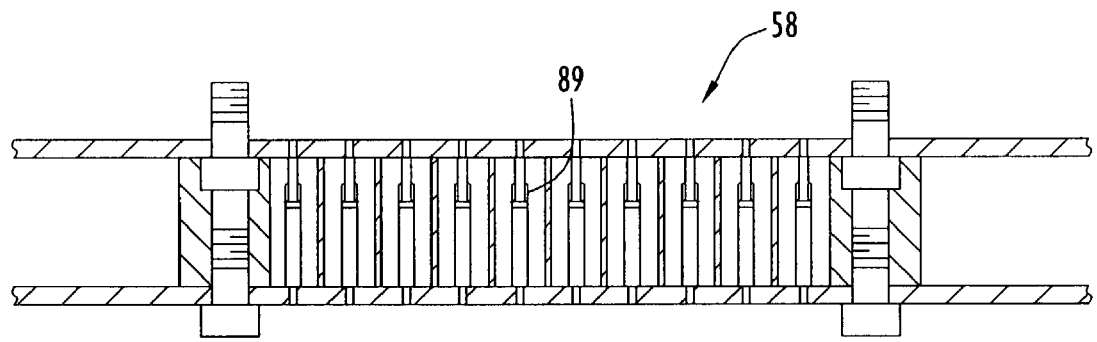
FIG. 8 is a cross-sectional side view of the analog connector.

FIGS. 7 and 8 respectively show a plan view and a cross-sectional side view of a non-limiting representative example of a high-density coaxial analog connector 58. As with the digital connector, it will be understood that the invention is not limited to the particular configuration and dimensions described in connection the analog connector shown in FIGS. 7 and 8. Analog connector 58 is a 32-pin connector having an approximately 0.095 inch center spacing between adjacent pins 80, with a center row of ten pins and upper and lower rows of eleven pins. The overall width of the analog connector in the direction of the rows is approximately 1.25 inches. As shown in greater detail in FIG. 9, each pin that is to carry an analog signal includes a center wire conductor 82 coupled via a compressor-type coupling member 84 to an adjacent conductor 86. The conductors are surrounded by a dielectric layer 88. Like the digital connector, the analog connector seats on pads and makes contact with pads with a spring loaded metal crowns that contact pads on the board with sharp edges. Once mounted to individual boards, the connectors and modules can be stacked up to whatever height is needed based on the terminal configuration.

Simulations of a 32-pin RF connector was performed to ensure that the crown's points making contact with the circuit board's pads would not cause any unwanted reflections. The simulations showed losses in the hundredths of a dB, and return losses in the −10 to −20 dB for the 100 to 300 MHz range. This simulation is a worst case showing the through resistance of the material to be 0.1 ohm.

The coupling members between conductors in both the digital and segmented analog busses can be fuzz button contacts. Fuzz buttons are small electrical contact elements manufactured from a single strand of fine gold-plated beryllium copper wire which is die compressed into a cylindrical form to form a solderless wire mass having excellent spring characteristics and low impedance. The fuzz buttons provide conductivity between conductors of adjacent modules as the modules are pressed together, ensuring conductivity throughout the busses with a controlled impedance and high tolerance to mechanical vibration. As shown in FIG. 8, the end of one conductor has a hollowed-out or cup portion 89 at its end for receiving the adjacent conductor. The fuzz button rests in the hollowed out end of the conductor, and when the conductors are pressed together, the fuzz button expands and fills the volume of the cup and ensure conductivity. While fuzz button contacts provide good electrical and mechanical contact between conductors of the busses, the invention is not limited to any particular coupling mechanism, and devices other than fuzz button contacts can be used, provided adequate electrical and mechanical requirements are met.

Figure 11:
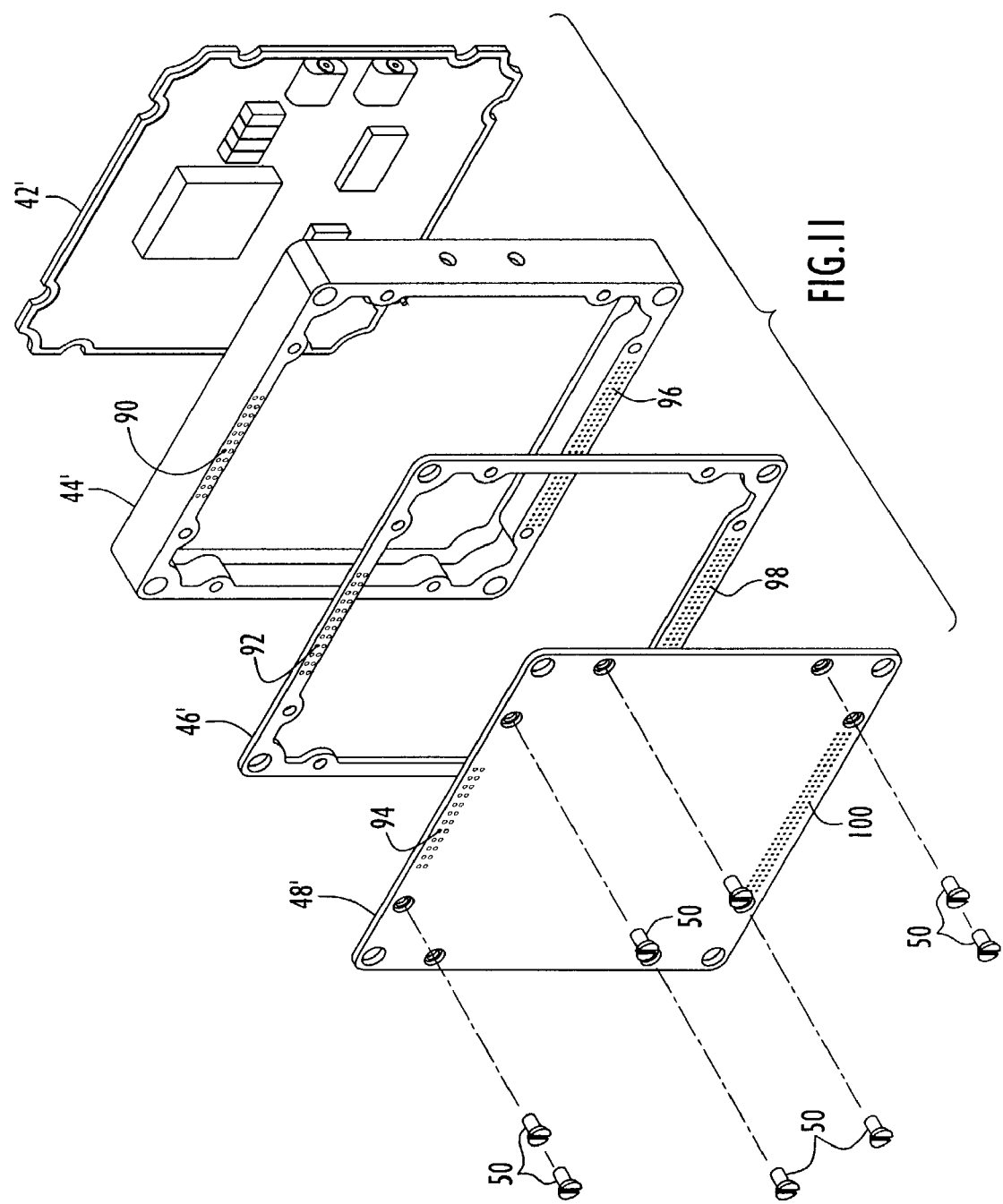
FIG. 11 is an exploded perspective view of a module structure including arrays of holes in the module frame to receive the digital and segmented analog bus conductors in accordance with another embodiment.

In FIGS. 2–10, the connectors that form the digital and segmented coaxial analog bus are essentially stand-alone connector elements that are mounted onto the printed circuit board. In accordance with another embodiment shown in FIG. 11, the multi-conductor connectors can be integrated directly into the ring-shaped frame by passing the conductors through arrays of holes formed in the frame. Aligned arrays of holes 90, 92 and 94 respectively formed in frame 44', gasket 46' and bottom plate 48' individually receive the center wire conductors and surrounding dielectric of the coaxial conductors of the segmented analog bus. The aluminum frame itself can serve as the outer grounding conductor or RF shield of the coaxial conductors. Likewise aligned arrays of holes 96, 98 and 100 respectively formed in frame 44', gasket 46' and bottom plate 48' individually receive the insulated conductors of the digital bus. Unlike the prior embodiment, this embodiment does not require stand-alone connectors to be mounted as components somewhere inside the perimeter of the frame, thereby conserving space on the printed circuit board 42'. Optionally, only one of the analog and digital busses can be integrated into the frame structure, with the other bus being formed from stand-alone connectors mount on the circuit boards in the manner previously described.

The processing modules of the RF terminal are designed to be substantially generic hardware building blocks from which a wide variety of terminal configurations can be assembled and program with software to operate as required by a particular application or mission. The number and configuration of RF transmit and receive channels can be set to any desired number simply by including the appropriate number of modules.

Figure 12A:
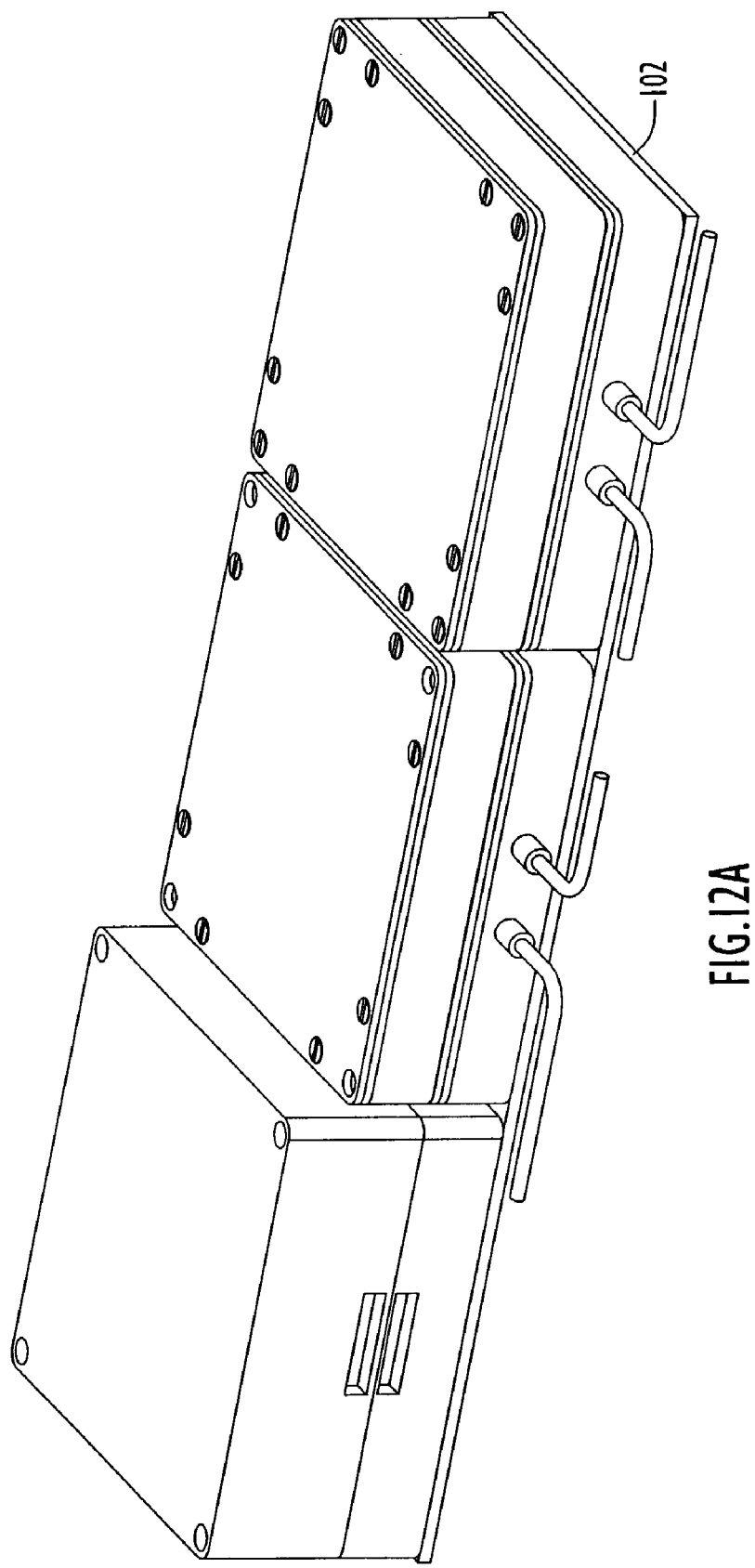
FIG. 12A is a perspective view of a modular RF terminal mounted on a rigid substrate in accordance with another embodiment.

In certain contexts, it may be desirable or necessary to mount some or all of the modules on a rigid circuit board. FIG. 12A illustrates an embodiment in which three modules are mounted directly on a rigid circuit board 102, while other modules are stacked on top of the board-mounted modules. In this case, the digital and analog connectors of the board-mounted modules are connected at one end to circuit board 102, while the stacked modules interconnect with the board-mounted modules in the manner previously described. Whether arranged in the stacked configuration or on a rigid circuit board, the individual modules require little, if any, hardware reconfiguration.

Figure 12B:
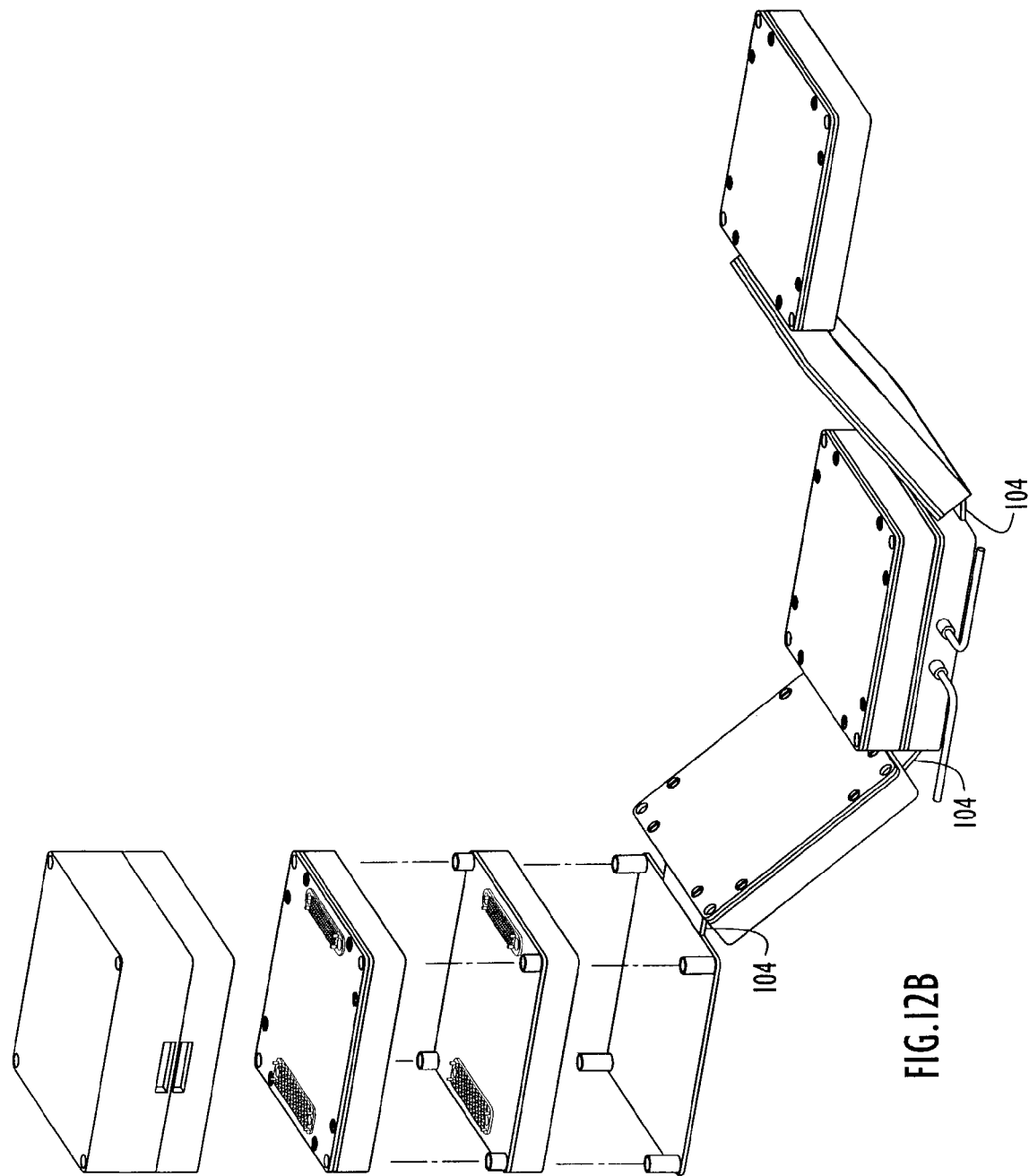
FIG. 12B is a perspective view of a modular RF terminal in which a number of the modules are interconnected by a flexible substrate in accordance with another embodiment.

In accordance with yet another embodiment of the modular RF terminal, at least some of the modules of the terminal are interconnected by a flexible substrate. As shown in FIG. 12B, certain modules are connected by flexible substrates comprising ribbons of conductors. A portion of the conductors within the ribbon is used to convey digital signals, forming a portion of the digital bus, while other conductors within the ribbon convey analog signals and constitute a portion of the segmented analog bus. The flexible substrate permits the terminal to assume a variety of contours that may be desirable in a particular context. Any of the described configurations (i.e., stacked (no substrate), rectangular, (rigid substrate) or contour (flexible substrate)) can be used in combination to achieve a desired shape and mechanical arrangement of the terminal.

Thus, in general, the terminal comprises a collection of interchangeable hardware modules that can be integrated in a variety of combinations to realize software programmable transceiver platforms that are flexible, scalable, and mission specific. Each platform configuration forms a single transceiver unit with specific programmable hardware resources and is capable of hosting a variety of general purpose or specialized communication and navigation software applications. Attributes of terminal-based platforms and resident software applications include the capabilities to: simultaneously process multiple transmit and receive RF bands; simultaneously process multiple channels within each RF band; and simultaneously perform communications, navigation and sensor processing. The small mechanical housing provides adequate robustness for the rigors of conditions such as launch and in-orbit operation, including conductive cooling, radiation shielding, shock/vibration resistance, and durability.

The terminal includes programmable circuitry (e.g., field programmable gate arrays (FPGAs) and digital signal processors (DSPs)) rather than fixed functionality associated with application specific integrated circuits (ASICs). Using an internal memory paging system, the terminal is remotely reprogrammable in the field allowing updating and changing of terminal functionality to extend the potential service lifetime of the terminal. In prior development of low power transceivers for airborne and space-borne communications, navigation and sensing was based on open standards, such as PC-104 standards, which imposed restrictions on size reduction. To achieve further size reduction, the RF terminal preferably does not adhere to PC-104 standards. Additional reduction in size, cost and power are realized by processing communication, navigation and sensor signals with the same digital signal processing modules, thereby truly integrating these signal processing functions. With appropriate configuration, the terminal supports communications that include platform to ground links, platform to platform links, platform to relay platform links, beamforming, MUD, RAKE and other communications/signal processing. Further, the terminal can potentially support navigation functions such as GPS, inertial navigation, and coherent turnaround (ranging and Doppler) as well as other signal processing, such as direction finding, EW, SIGINT, and COMINT. The terminal can be augmented to include data and message processing functions (e.g., CADH functions) and to interface with embedded encryption/decryption functions. Given its reduced size, the terminal is particularly well-suited to satisfy emerging demands for very small communication/navigation systems, such as formations of flying microsatellites, for which larger transceivers may be deemed as being too large.

An important achievement of the disclosed terminal is the realization of a modular and scalable signal processing platform that goes well beyond previous technology in terms of size, signal bandwidth and processing capacity and that meets a wide array of future mission needs. This platform is highly programmable and lends itself to both NASA and other government and commercial uses. As an FPGA based technology designed to meet the rigors of space, the terminal provides a multifunctional means to support a wide array of needs throughout the mission lifetime. For instance, terminal clock speeds, low-power modes, and other means can be applied as part of the mission power management scheme. In the case of most missions, where every spacecraft function does not have to be performed at the same instant in time, the same terminal device can be configured to support varying scientific measurements, high/low rate communication, electronic beamforming, navigation, signal processing, correlation and control functions during missions by sharing and/or reconfiguring the resident FPGA resource. More demanding missions can simply carry more FPGA resources. Finally, FPGA technology is a key enabler to accommodate remote upgrades and changes to observation and measurement platform functionality in the future. In other words, use of FPGA technology permits functionality of on-orbit spacecraft to be altered so as to adapt to mission needs, changes in external interfaces (e.g., ground communications formats), and other circumstances.

Having described preferred embodiments of a modular RF terminal having an integrated bus structure, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A modular RF terminal, comprising:
   a plurality of processing modules, at least one of the processing modules having an external connector for conveying an RF signal; and
   a segmented coaxial analog bus comprising a plurality of multi-conductor coaxial connectors, each of the multi-conductor coaxial connectors being integrated in or forming a portion of a corresponding one of the processing modules, wherein the segmented coaxial analog bus conveys RF signals between the at least one of the processing modules having the external connector and at least one other of the processing modules; and
   wherein each of the plurality of multi-conductor coaxial connectors is part of a segment of the segmented coaxial analog bus and is selectively configurable to pass or not pass an analog signal on a particular conductor of the multi-conductor coaxial connector on a processing module-by-processing module basis such that analog signals can selectively be sent over certain segments of the segmented coaxial analog bus to control which signals are available to which processing modules, and wherein each multi-conductor coaxial connector of a respective processing module is selectively configurable by being selectively populated with one or more conductors for selectively routing analog signals along segments of the segmented coaxial analog bus between adjacent processing modules.

2. The modular RF terminal of claim 1, wherein individual processing modules include a circuit board extending along a plane, and wherein a multi-conductor coaxial connector is mounted on the circuit board with conductors of the multi-conductor coaxial connector extending substantially orthogonal to the plane of the circuit board.

3. The modular RF terminal of claim 1, wherein each processing module comprises a housing frame along the perimeter of the processing module, and wherein conductors of the multi-conductor coaxial connectors extend through holes in the housing frame in a direction toward adjacent processing modules.

4. The modular RF terminal of claim 1, wherein the analog bus conveys at least one of RF signals, intermediate frequency (IF) signals, and local oscillator (LO) reference signals.

5. The modular RF terminal of claim 1, wherein each of the processing modules comprises a substantially plate-like layer structure.

6. The modular RF terminal of claim 5, wherein each of the processing modules includes a housing comprising a perimeter wall providing spacing between first and second substantially flat, parallel surfaces, wherein conductors of the multi-conductor coaxial connectors extend in a direction substantially orthogonal to the first and second surfaces.

7. The modular RF terminal of claim 6, wherein at least some of the processing modules are arranged in a stacked configuration with abutting first and second surfaces, wherein corresponding conductors of coaxial connectors of adjacent processing modules are electrically connected to form segments of the segmented coaxial analog bus.

8. The modular RF terminal of claim 6, wherein at least some of the processing modules are mounted on a rigid substrate.

9. The modular RF terminal of claim 6, wherein at least some of the processing modules are interconnected by a flexible substrate.

10. The modular RF terminal of claim 1, further comprising a digital bus comprising a plurality of multi-conductor connectors, each of the multi-conductor connectors being integrated in or forming a portion of one of the processing modules, wherein the digital bus conveys digital signals to the processing modules.

11. The modular RF terminal of claim 10, wherein individual processing modules include a circuit board extending along a plane, and wherein a multi-conductor digital connector is mounted on the circuit board with conductors of the multi-conductor digital connector extending substantially orthogonal to the plane of the circuit board.

12. The modular RF terminal of claim 1, wherein each processing module comprises a housing frame along the perimeter of the processing module, and wherein conductors of the multi-conductor digital connectors extend through holes in the housing frame in a direction toward adjacent processing modules.

13. The modular RF terminal of claim 1, wherein the modular RF terminal has a substantially rectangular parallelepiped shape.

14. The modular RF terminal of claim 13, wherein the modular RF terminal has a substantially cube-like shape.

15. The modular RF terminal of claim 1, wherein the processing modules include at least one RF transmit module and one RF receive module.

16. The modular RF terminal of claim 15, wherein a number of transmit or receive channels is expandable by adding additional modules to the modular RF terminal.

17. The modular RF terminal of claim 1, wherein the at least one other of the processing modules is a digital signal processing module, wherein the digital signal processing module digitizes analog signals received on the segmented coaxial analog bus.

18. A modular RF terminal, comprising:
   a plurality of plate-like processing modules, each processing module including: a housing comprising a perimeter wall providing spacing between first and second substantially flat, parallel surfaces, and a multi-conductor connector extending in a direction substantially orthogonal to the first and second surfaces and accessible through at least one of the first and second surfaces such that said multi-conductor connector forms a segmented coaxial analog bus, wherein each of the plurality of multi-conductor coaxial connectors is part of a segment of a segmented coaxial analog bus and is selectively configurable to pass or not pass an analog signal on a particular conductor of the multi-conductor coaxial connector on a processing module-by-processing module basis, such that analog signals can selectively be sent over certain segments of the segmented coaxial analog bus to control which signals are available to which processing modules, and wherein each multi-conductor coaxial connector of a respective processing module is selectively configurable by being selectively populated with conductors for selecting routing analog signals along segments of the segmented coaxial bus between adjacent processing modules;

wherein individual plate-like processing modules are configurable to be: stacked with at least one of the first and second surfaces abutting a first or second surface of an adjacent module; mounted on a rigid substrate; and connected to an adjacent module by a flexible substrate, such that multi-conductor connectors of the processing modules are connected to each other to form a bus structure through the modular RF terminal.

19. The modular RF terminal of claim 18, wherein the multi-conductor connector of each processing module is a multi-pin connector mounted on a circuit board extending substantially along a plane, with conductors of the multi-conductor connector extending substantially orthogonal to the plane of the circuit board.

20. The modular RF terminal of claim 18, wherein conductors of the multi-conductor connector of each processing module extend through holes in the perimeter wall of the housing in a direction toward adjacent processing modules.

21. The modular RF terminal of claim 18, further comprising a digital bus comprising a plurality of multi-conductor connectors, each of the multi-conductor connectors being integrated in or forming a portion of one of the processing modules, wherein the digital bus conveys digital signals to the processing modules.

22. The modular RF terminal of claim 18, further comprising a digital bus comprising multi-conductor connectors of the processing modules.

23. The modular RF terminal of claim 18, wherein the modular RF terminal has a substantially cube-like shape.

24. The modular RF terminal of claim 18, wherein the modular RF terminal has a substantially rectangular parallelepiped shape.

25. The modular RF terminal of claim 1, wherein each processing module comprises a perimeter wall providing a spacing between first and second substantially parallel surfaces that have a greater surface area than the perimeter wall, wherein conductors of the multi-conductor coaxial connectors extend through holes in the perimeter wall in a direction substantially orthogonal to the first and second surfaces.

26. The modular RF terminal of claim 25, wherein the conductors of the multi-conductor coaxial connectors extend through the first and second surfaces.

27. The modular RF terminal of claim 1, wherein a multi-conductor coaxial connector of one of the processing modules is connected to a multi-conductor coaxial connector of at least one adjacent processing module.

* * * * *